United States Patent
Ikemoto

(10) Patent No.: US 8,723,208 B2
(45) Date of Patent: May 13, 2014

(54) LIGHT-EMITTING DEVICE HAVING A FINE STRUCTURE INTERPOSED BETWEEN A LIGHT-EMITTING LAYER AND A SUBSTRATE

(75) Inventor: Kiyokatsu Ikemoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 229 days.

(21) Appl. No.: 13/324,223

(22) Filed: Dec. 13, 2011

(65) Prior Publication Data

US 2012/0153331 A1    Jun. 21, 2012

(30) Foreign Application Priority Data

Dec. 20, 2010  (JP) ................................. 2010-283774

(51) Int. Cl.
*H01L 33/00* (2010.01)

(52) U.S. Cl.
USPC ................................. 257/98; 257/99; 257/100

(58) Field of Classification Search
USPC ................................. 257/98, 99, 100; 313/506
See application file for complete search history.

(56) References Cited

U.S. PATENT DOCUMENTS

| | | | |
|---|---|---|---|
| 6,476,550 B1 * | 11/2002 | Oda et al. | 313/504 |
| 2011/0025201 A1 * | 2/2011 | Ikemoto | 313/506 |

* cited by examiner

*Primary Examiner* — Matthew Reames
*Assistant Examiner* — Farid Khan
(74) *Attorney, Agent, or Firm* — Canon USA Inc. IP Division

(57) ABSTRACT

A light-emitting device includes a light-emitting layer and a fine structure interposed between the light-emitting layer and a substrate, wherein the fine structure includes a laminate of a first fine substructure and a second fine substructure, the first and second fine substructures each includes a first member and second members disposed in the first member, the second members having a refractive index different from the refractive index of the first member and being periodically arranged in a direction parallel to a surface of the substrate, and the second members of the first fine substructure and the second members of the second fine substructure have different arrangement periods.

9 Claims, 6 Drawing Sheets

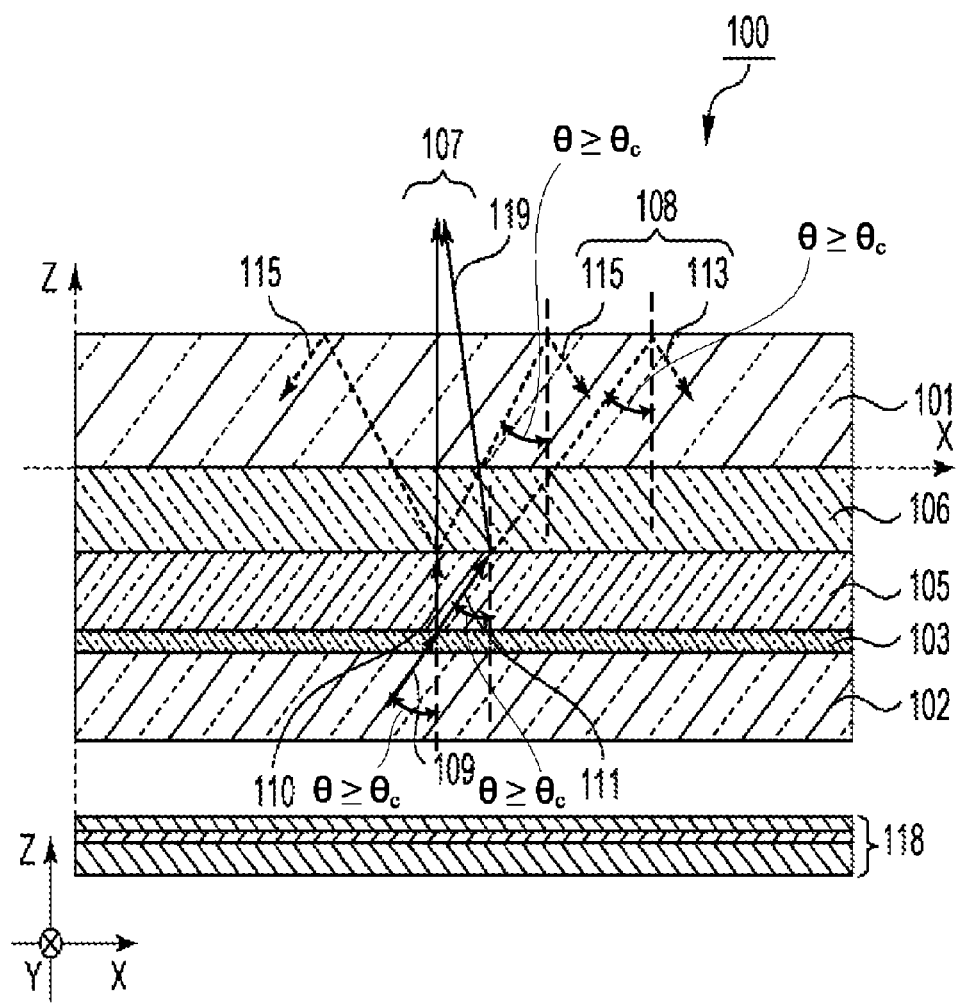

LIGHT-EMITTING DEVICE HAVING A FINE STRUCTURE INTERPOSED BETWEEN A LIGHT-EMITTING LAYER AND A SUBSTRATE

BACKGROUND OF THE INVENTION

1. Field of the Invention

The present invention relates to a light-emitting device having high light-extraction efficiency.

2. Description of the Related Art

There are known light-emitting devices of various configurations. An example of such a known light-emitting device is illustrated in the sectional view in FIG. 6. The light emitting device 1000, which is illustrated in FIG. 6, includes a front panel 1001, a light-emitting layer 1002, and a transparent electrode 1003, which is part of an excitation source for exciting the light-emitting layer 1002. The front panel 1001 is made of a transmissive medium that transmits visible light, for example, glass or plastic. The excitation source includes, for example, an electron-emitting device 1005, which opposes the front panel 1001, and the transparent electrode 1003, which is disposed on the front panel 1001. With such a configuration, electrons emitted as a result of applying an electric field to the electron-emitting device 1005 are accelerated in the transparent electrode 1003, which is disposed on the front panel 1001, and are incident on the light-emitting layer 1002, causing light to be generated. The light generated at the light-emitting layer 1002 is transmitted through the front panel 1001 and is extracted to the outside as output light 1004. The proportion of the output light 1004 extracted to the outside to the light generated at the light-emitting layer 1002 is known as "light-extraction efficiency."

One cause of a reduction in light-extraction efficiency in the emitting device 1000 is loss caused by total internal reflection at the boundary of the front panel 1001 and the transparent electrode 1003 of the excitation source or at the boundary of the light-emitting layer 1002 and the transparent electrode 1003 of the excitation source. Specifically, it is known that when light is transmitted through a boundary between a high refractive index medium to a low refractive index medium, light that is transmitted at an angle larger than a critical angle of incidence is totally reflected and trapped inside the high refractive index medium. The reflected and trapped light is not extracted into the low refractive index medium, instead it is transmitted through the high refractive index medium, and is lost.

To reduce total reflection loss and improve light-extraction efficiency, U.S. Pat. No. 6,476,550 describes a configuration in which a fine structure is interposed between members having different refractive indexes, as illustrated in FIG. 7. A light-emitting device 1100, which is illustrated in FIG. 7, includes a front panel 1101, a light-emitting layer 1102, a transparent electrode 1103, an electrode layer 1104, and a fine structure 1105, which is interposed between the front panel 1101 and the transparent electrode 1103. The fine structure 1105 includes multiple media having different refractive indexes and has a refractive index distribution with a cycle similar to the wavelength of light. In this manner, light that is generated inside the light-emitting layer 1102 and transmitted at an angle larger than the critical angle is converted to light that is transmitted at an angle equal to or smaller than the critical angle by diffraction, thus increasing the amount of light 1106 extracted to the outside.

With the procedures described in U.S. Pat. No. 6,476,550, there is a need for improvement in the light-extraction efficiency. In FIG. 7, part of the light emitted from the light-emitting layer 1102 and transmitted through the fine structure 1105 is transmitted and diffracted, and the remaining light becomes 0-order transmitted light. When light having a small incident angle is incident on the fine structure 1105, part of the light is diffracted as diffracted light 1107, which is transmitted at an angle larger than the critical angle. The diffracted light 1107 is totally reflected at the boundary and lost. When light having a large incident angle is incident on the fine structure 1105, non-diffracted light, i.e., 0-order transmitted light 1108, is transmitted at an angle larger than the critical angle at the boundary of the front panel 1101 and the outside, is totally reflected at the boundary, trapped inside the front panel 1101, and is lost. In other words, with known procedures, increasing the diffraction efficiency of the fine structure 1105 increases the amount of diffracted light 1107, and decreasing the diffraction efficiency increases the amount of the transmitted light 1108. In this way, the fine structure 1105 limits the light extracted to the outside to light incident on the fine structure 1105 at a specific angle, and the light-extraction efficiency is not sufficiently improved.

SUMMARY OF THE INVENTION

To solve the problem described above, the present invention provides a light-emitting device including a light-emitting layer; and a fine structure interposed between the light-emitting layer and a substrate, wherein the fine structure includes a laminate of a first fine substructure and a second fine substructure, the first fine substructure and the second fine substructure each includes a first member and second members, the second members having a refractive index different from the refractive index of the first member and being periodically arranged in the first member in a direction parallel to a surface of the substrate on which the light-emitting layer is disposed, and an arrangement period of the second members of the first fine substructure differs from an arrangement period the second members of the second substructure.

The present invention provides a light-emitting device having high light-extraction efficiency and high luminance.

Further features of the present invention will become apparent from the following description of exemplary embodiments with reference to the attached drawings.

BRIEF DESCRIPTION OF THE DRAWINGS

FIG. 2 illustrates the principle of light-extraction efficiency improvement in the first example of the present invention.

DESCRIPTION OF THE EMBODIMENTS

An embodiment of the present invention will be described in detail with reference to the drawings.

Figure 1A:
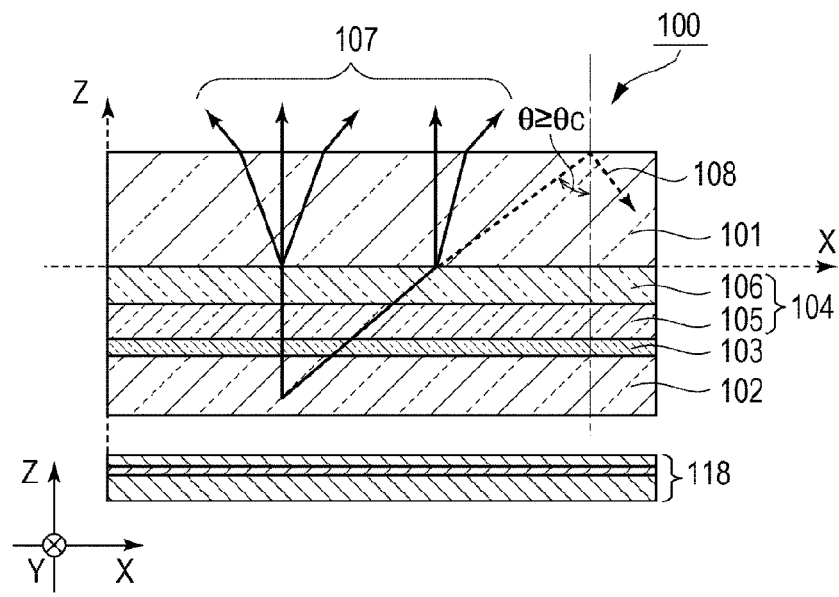
FIG. 1A is an xz sectional view of a light-emitting device according to a first example of the present invention.
Figure 1B:
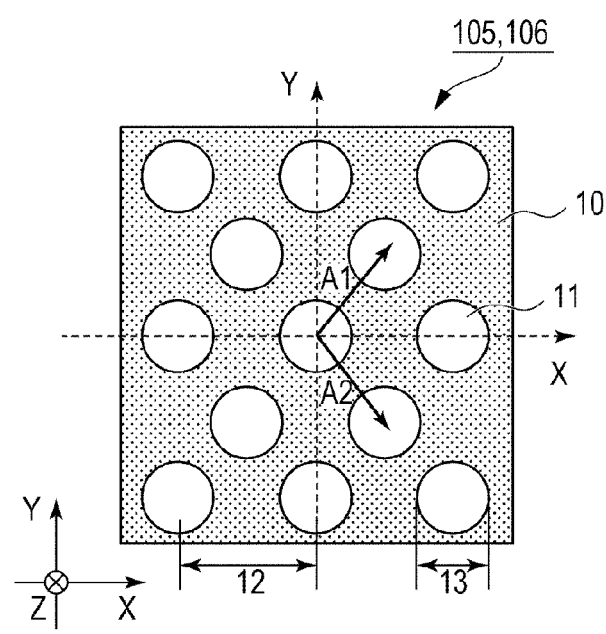
FIG. 1B is an xy sectional view of a fine structure included in the light-emitting device according to the first example of the present invention.
Figure 1C:
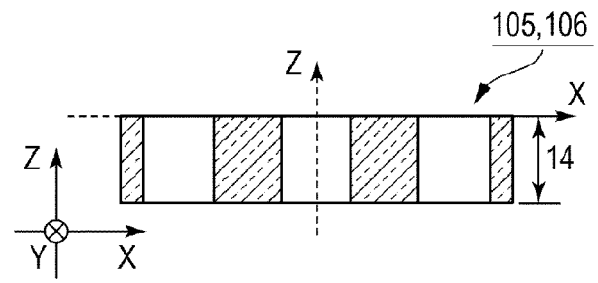
FIG. 1C is an xz sectional view of a fine structure included in the light-emitting device according to the first example of the present invention.

FIGS. 1A, 1B, and 1C are schematic views of a light-emitting device 100 according to a first example of the present invention. FIG. 1A is an xz sectional view of the light-emitting device 100; FIG. 1B is an xy plan view of a partial structure (one of periodic structures 105 and 106, which are described below) of a fine structure 104; and FIG. 1C is an xz sectional view of a partial structure (one of the periodic structures 105 and 106, which are described below) of the fine structure 104. The light-emitting device 100 includes a front panel 101, a light-emitting layer 102, a fine structure 104, and, desirably, a transparent electrode 103, which is part of an excitation source. The excitation source includes an electron-emitting device 118, which is disposed on a member (for example, a substrate) opposing the front panel 101 as described below, and the transparent electrode 103, which is disposed on the front panel 101.

The front panel 101 is made of an optically transmissive material (medium) that transmits visible light, for example, glass. The light-emitting layer 102 is, for example, a film containing a fluorescent member (fluorescent material) and generates light having a wavelength in the range of 350 and 800 nm, which is a visible light range. In this embodiment, it is desirable that the transparent electrode 103, which is part of the excitation source, be disposed on a side of the light-emitting layer 102 facing the front panel 101. The position of the transparent electrode 103 is not limited thereto; the transparent electrode 103 may be disposed on an exposed surface (a side of the light-emitting layer 102 facing the electron-emitting device 118 as described below, which is also referred to as "back side") of the light-emitting layer 102.

The fine structure 104 is interposed between the front panel 101 and the light-emitting layer 102. In other words, the light-emitting layer 102 is disposed on the fine structure 104, and the fine structure 104 is disposed on a substrate, which is the front panel 101. The fine structure 104 includes a laminated body of a first fine substructure 105 and a second fine substructure 106. The first fine substructure 105 and the second fine substructure 106 each includes a first member 10 and second members 11, as shown in FIG. 1B. The second members 11, are disposed in the first member 10 and have a refractive index different from the refractive index of the first member 10; the second members 11 are periodically arranged in the first member 10 on the xy plane, which is parallel to the surface of the front panel 101 on which the light-emitting layer 102 is disposed. The second members 11 of the first fine substructure 105 and the second members 11 of the second fine substructure 106 have different arrangement periods. In the description below, the first fine substructure 105 and the second fine substructure 106 may also be referred to as a periodic structure 105 and a periodic structure 106, respectively. FIG. 1B illustrates an example configuration of one of the periodic structures 105 and 106 on the xy plane viewed in the z direction; and FIG. 1C illustrates an example configuration of one of the periodic structures 105 and 106 on the xz plane viewed in the y direction (xz sectional view). As illustrated in FIG. 1B, in each of the periodic structures 105 and 106, columnar structures 11, which are the second members 11 made of a second medium, are two-dimensionally and periodically arranged in the layer of the first member 10, which is made of a first medium having a refractive index different from that of the second medium. In the drawing, vectors A1 and A2 are basic lattice vectors, and the columnar structures 11, which are made of the second medium, are disposed at positions represented by the sum or difference of the basic lattice vectors A1 and A2, forming a triangular lattice. The vector A1 is a vector $(0.5a, \sqrt{3}a/2, 0)$, and the vector A2 is a vector $(0.5a, -29\ 3a/2, 0)$, where a represents the length of a lattice period 12. The periodic structure 105 and the periodic structure 106 have different diffraction characteristics corresponding to the angles of light incident on the structures. In this embodiment, the length a of the lattice period 12 of the structures differs.

The excitation source includes, for example, the transparent electrode 103 and the electron-emitting device 118, which opposes the transparent electrode 103. Electrons emitted as a result of applying an electric field to the electron-emitting device 118 are accelerated in the transparent electrode 103 and are incident on the light-emitting layer 102, causing light to be generated. In FIG. 1A, $\theta_c$ represents a critical angle at the boundary of the front panel 101 and the outside. The light that is generated at the light-emitting layer 102 and incident on the fine structure 104 is diffracted at the periodic structure 105, generating 0-order transmitted light and multiple beams of diffracted light. When each of these beams is incident on the periodic structure 106, multiple beams of diffracted light and 0-order transmitted light are generated. Light that is transmitted at an angle equal to or smaller than the critical angle $\theta_c$ is emitted to the outside as output light 107, whereas light that is transmitted at an angle larger than the critical angle $\theta_c$ is totally reflected at the boundary, is not emitted outside, resulting in lost light 108. With the fine structure 104 according to this embodiment, the amount of light in the light-emitting layer 102 that is converted to lost light 108 is decreased, and the light in the light-emitting layer 102 is efficiently converted into the output light 107, improving light-extraction efficiency.

The light-emitting device 100 according to this embodiment is capable of achieving high light-extraction efficiency as described below.

FIG. 2 is a schematic view illustrating how the front panel 101 according to the present invention can establish high light-extraction efficiency. In FIG. 2, the front panel 101, the light-emitting layer 102, the transparent electrode 103, which is part of the excitation source, and the periodic structures 105 and 106 are the same as those illustrated in FIG. 1. Transmitted light 110 is diffracted at the periodic structure 105 and transmitted at an angle smaller than the critical angle $\theta_c$, and transmitted light 111 is diffracted at the periodic structure 105 and transmitted at an angle larger than the critical angle $\theta_c$. The light generated at the light-emitting layer 102 is transmitted in various directions inside the light-emitting layer 102. When the solid angle is considered, the amount of light that is transmitted at an angle near the perpendicular direction of the front panel 101 is smaller than the amount of light that is transmitted at an angle near the parallel direction. Incident light 109 is transmitted through the light-emitting layer 102 and incident on the periodic structure 105 at an angle larger than the critical angle $\theta_c$.

By configuring the periodic structure 105 such that the diffraction efficiency is high for the light 109 having a larger incident angle, the transmitted light 110 becomes more intense than the transmitted light 111. The periodic structure 106 is configured such that the diffraction efficiency of the light 110 having a small incident angle is low and such that at least part of the light 111 having a large incident angle is diffracted.

In this way, the incident light 110 is prevented from being converted to light 115, which is transmitted at an angle larger than the critical angle $\theta_c$, reducing the amount of lost light 108. Since part of the light 111 is converted to light 119, which is transmitted at an angle smaller than the critical angle $\theta_c$, the amount of output light 107 can be increased.

By configuring the periodic structure 105 such that the diffraction efficiency is low for the light 109 having a large incident angle, the transmitted light 111 becomes more intense than the transmitted light 110. The periodic structure 106 is configured such that the diffraction efficiency is high for the transmitted light 111 having a large incident angle, and thus, the transmitted and diffracted light 119, which is transmitted at an angle smaller than the critical angle $\theta_c$, is generated with high intensity. In this way, the amount of transmitted light 113 can be decreased, and the amount of the output light 107 can be increased. When the diffraction efficiency of the periodic structure 106 is low for the transmitted light 110 having a small incident angle, the amount of light 115 transmitted at an angle larger than the critical angle $\theta_c$ is reduced, decreasing the amount of lost light 108 and further increasing the amount of output light 107.

In this way, even when the diffraction characteristics of the periodic structure 105 are set such that either the transmitted light 110 or the transmitted light 111 is intensely output, so long as the diffraction characteristics of the periodic structure 106 is opposite to the diffraction characteristics of the periodic structure 105, the amount of output light 107 can be increased.

Figure 4:
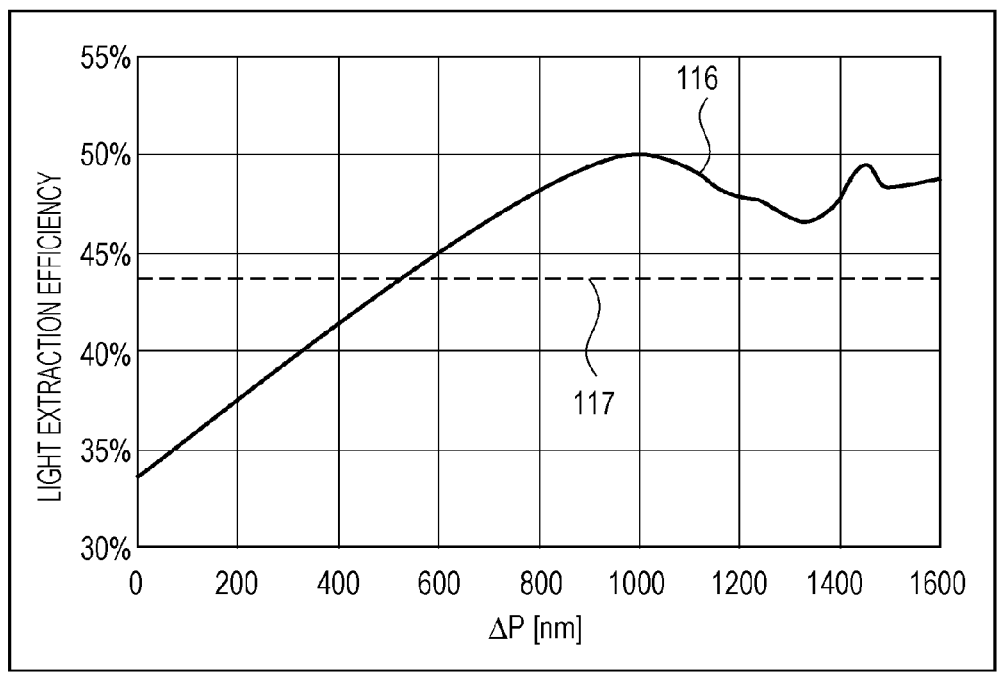
FIG. 4 is a graph illustrating the results of the calculated light-extraction efficiency in the first example of the present invention.

Specifically, as illustrated in FIG. 4, which is described below, by setting different arrangement periods (lattice periods) for the second members 11 of the periodic structure 105 and the periodic structure 106, the display light 107 can be increased as described above. Accordingly, the amount of lost light is reduced, and a light-emitting device having high light-extraction efficiency can be acquired.

The fine structure according to this embodiment including a laminate of periodic structures having different periods achieve the effects described above as described below.

$K_{outx}$ represents a wavenumber vector component of light that is incident on the fine structure 104 and diffracted at the periodic structure 105 and the periodic structure 106 and that extends in a direction parallel to a plane on which the light-emitting layer 102 of the front panel 101 (i.e., on the plane). $K_{outx}$ can be represented by Expression 1 based on a generation diffraction expression.

$$K_{outx}=K_{inx}+mG_{105}+nG_{106} \text{ (where } m \text{ and } n \text{ are integers)} \quad (1)$$

In Expression 1, m and n are integers representing the orders of diffraction of the periodic structure 105 and the periodic structure 106. An incident-side medium is disposed immediately before where light is incident on the fine structure 104. In this embodiment, the incident-side medium is the medium constituting the transparent electrode 103, which is part of the excitation source. $K_{inx}$ represents a wavenumber vector component of light in the incident-side medium on a plane parallel to the front panel 101. In this embodiment, $K_{inx}$ represents a wavenumber vector component of light in the transparent electrode 103 of the excitation source on a plane parallel to the front panel 101. $G_{105}$ and $G_{106}$ respectively represent reciprocal lattice vectors of the periodic structures 105 and 106 and are respectively represented by Expressions 2 and 3.

$$G_{105}=2\pi/P_{105} \quad (2)$$

$$G_{106}=2\pi/P_{106} \quad (3)$$

In Expressions 2 and 3, $P_{105}$ and $P_{106}$ respectively represent the periods of the second members 11 in the periodic structures 105 and 106. $K_{sub}$ represents a wavenumber vector of light in a transmissive-side medium and, in this embodiment, represents a wavenumber vector in the front panel 101. In Expression 1, light is transmitted and diffracted on an order of diffraction in which $K_{outx}$ is smaller than $K_{sub}$, and light is not transmitted and diffracted on an order of diffraction in which $K_{outx}$ is larger than $K_{sub}$. The relationship between the angle of light incident on a periodic structure and the resulting diffracted light is controlled by the size (length) of the periods of the second members 11 of the periodic structures. $K_{cx}$ represents the length of a wavenumber vector of light transmitted through the front panel 101 and at the critical angle $\theta_c$ on a plane parallel to the front panel 101 and is represented by Expression 4.

$$K_{cx}=K_{sub}\sin(\theta_c) \quad (4)$$

With the light represented by Expression 1, light of which $K_{outx}$ is smaller than $K_{cx}$, i.e., light having a transmitting angle smaller than the critical angle $\theta_c$, is emitted from the front panel 101 to the outside as output light 107. Light of which $K_{outx}$ is larger than $K_{cx}$ is totally reflected at the boundary of the front panel 101 and the outside, resulting in lost light 108. Expression 1 may also be represented as Expressions 5 and 6.

$$K_{outx}=K'_{outx}+n\Delta G \text{ (where } m \text{ and } n \text{ are integers)} \quad (5)$$

$$K'_{outx}=K_{inx}+(m+n)G_{105} \text{ (where } m \text{ and } n \text{ are integers)} \quad (6)$$

$K'_{outx}$ in Expressions 5 and 6 represents a wavenumber vector component of light diffracted on (m+n) order at the periodic structure 105 on a plane parallel to the front panel 101. $\Delta G$ represents the difference of reciprocal lattice vectors of the periodic structure 105 and the periodic structure 106. Based on Expression 5, light transmitted through the fine structure 104 may be considered as light diffracted at the periodic structure 105 and further diffracted at a structure having a reciprocal lattice vector of $\Delta G$.

Figure 3:
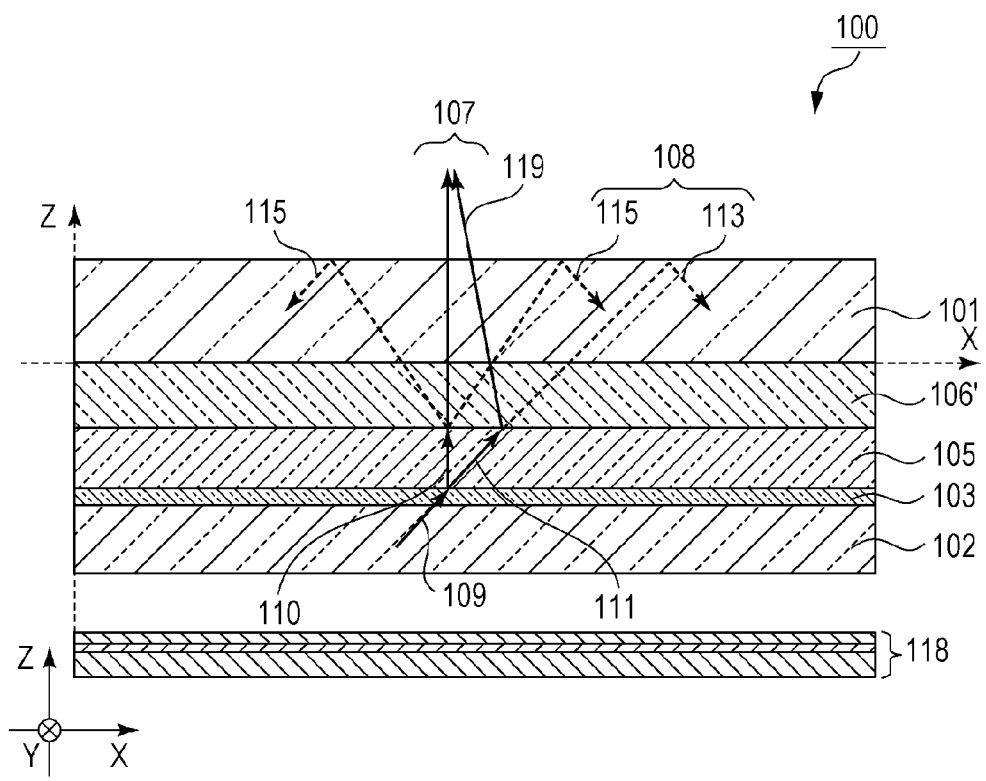
FIG. 3 illustrates the principle of light-extraction efficiency improvement in the first example of the present invention.

FIG. 3 is a schematic view illustrating how light-extraction efficiency can be increased in this embodiment by the fine structure 104, which includes a laminate of the periodic structures 105 and 106, having different periods for the second members 11 (see FIG. 1B). In FIG. 3, the front panel 101, the light-emitting layer 102, the transparent electrode 103, which is part of the excitation source, and the periodic structure 105 are the same as those illustrated in FIG. 1. A structure 106' has a reciprocal lattice vector of $\Delta G$, which represents the difference of the periods of the periodic structure 105 and the periodic structure 106. Among the beams of light diffracted on m+n order at the periodic structure 105, transmitted light 110 is light of which $K'_{outx}$ is smaller than $K_{cx}$, and transmitted light 111 is light of which $K'_{outx}$ is larger than $K_{cx}$. The intensity of the transmitted light 110 or 111 can be increased on the basis of the diffraction characteristics of the periodic structure 105 for the incident light 109. When the intensity of the transmitted light 110 is greater than the intensity of the transmitted light 111, generation of transmitted and diffracted light 115 can be prevented by setting $\Delta G$ such that the $K_{outx}$ is larger than $K_{sub}$ on the basis of Expression 5. Part of the transmitted light 111 is diffracted at the periodic structure 106' and is converted to transmitted light 119. In this way, the amount of lost light 108 is reduced, and the output light 107 can be increased. By setting the intensity of the transmitted light 111 greater than the intensity of the transmitted light 110 and setting $\Delta G$ such that $K_{outx}$ is smaller than $K_{cx}$, when n is a negative integer, transmitted and diffracted light 119 is generated, and the amount of transmitted light 113 is reduced. By setting $\Delta G$ such that $K_{outx}$ larger than $K_{sub}$, when n is a positive integer, light is totally reflected at the boundary of the front panel 101 and the outside, and the generation of diffraction light, which is lost, can be suppressed. In this way, the amount of lost light 108 can be reduced, and the amount of output light 107 can be increased.

To achieve the above-described effect, appropriate ΔG is set for the fine structure 104, which in a laminate of the periodic structure 105 and the periodic structure 106 having second members 11 with different arrangement periods. In this way, the amount of lost light is reduced, and a light-emitting device 100 having high light-extraction efficiency is acquired.

The diffraction characteristics of the periodic structure 105 and the periodic structure 106 corresponding to incident angles of light can be controlled not only by the length of the periods of the periodic structures 105 and 106 but also by the medium constituting the periodic structures 105 and 106 and the shape of the periodic structures 105 and 106.

By forming the periodic structure 105 and the periodic structure 106 with different media and shapes, different diffraction characteristics can be acquired. By configuring the periodic structure 105 with appropriate diffraction characteristics, the light from the light-emitting layer 102 incident on the periodic structure 105 at a large angle is efficiently converted to transmitted light 110 or 111. Then, the diffraction characteristics of the periodic structure 106 for the transmission angle of the transmitted light 110 or 111 is appropriately controlled, suppressing the generation of lost light 108, and increasing the amount of output light 107. In this way, a light-emitting device 100 having high light-extraction efficiency can be acquired.

It is desirable that the lattice periods (arrangement period of the second members 11) of the periodic structures 105 and 106 be in the range of 0.2 and 5 μm when the wavelength of the light emitted from the light-emitting layer 102 is in the range of 350 and 800 nm. When the lattice period is smaller than 0.2 μm, the reciprocal lattice vector of the corresponding periodic structure increases, and visible light is less likely to be diffracted. When the lattice period is larger than 5 μm, the diffraction efficiency decreases significantly. Periodic structures that satisfy the above ranges function as diffraction gratings. By laminating the periodic structures, a fine structure having high light-extraction efficiency is acquired, and a light-emitting device having high light-extraction efficiency can be acquired. It is particularly preferable that the lattice period (arrangement period of the second members 11) of at least one of the periodic structure 105 and the periodic structure 106 is in the range of 1 and 3 μm and, more preferably, be in the range of 1.5 and 2.5 μm. When the period is in the range of 1 and 3 μm, multiple beams of diffracted light can be generated along a large incident angle, and the diffraction efficiency can be increased. When the period is in the range of 1.5 and 2.5 μm, the diffraction efficiency can be increased even more. By using periodic structures having such lattice periods, the diffraction efficiency of the fine structure can be increased, and a light-emitting device having high light-extraction efficiency can be acquired.

With the configuration according to this embodiment, it is desirable that the difference of the lattice periods (arrangement periods of the second members 11) of the periodic structure 105 and the periodic structure 106 be 0.6 μm or larger.

When the difference of the lattice periods is small, the difference ΔG of the reciprocal lattice vectors is small. Base on Expression 5, when n is a small integer, $K_{outx}$ is larger than $K_{sub}$ but smaller than $K_{cx}$, and light is diffracted as lost light 108. Therefore, it is desirable that ΔG be a large value and the difference of the lattice periods be 0.6 μm or larger so as to prevent the lost light 108 and acquire a light-emitting device having high light-extraction efficiency.

With the configuration according to this embodiment, it is desirable that the periodic structure 105, which is the first fine substructure, be disposed closer to the light-emitting layer 102 than the periodic structure 106, which is the second fine substructure, and the arrangement period of the second members 11 of the periodic structure 105 be larger than the arrangement period of the second members 11 of the periodic structure 106. A periodic structure having a long (large) lattice period (arrangement period of the second members 11) generates multiple beams of diffracted light from incident light in a wide angle and a wide wavelength band, and high transmission and diffraction efficiency can be achieved. The amount of light generated at the light-emitting layer 102 and reflected at the periodic structure 105 can be reduced, and the reflected light can be efficiency converted to transmitted light 110 or 111. In this way, the amount of light emitted from the light-emitting layer 102 to the front panel 101 increases, and the light-extraction efficiency can be improved.

The medium in this embodiment, the lattice period 12, the diameter 13, and the height 14 of the columnar structures in each of the periodic structures 105 and 106 in the fine structure 104 may differ from those described in this embodiment.

As illustrated in FIG. 1, the structure in which the second members 11 are arranged in a triangular lattice (hereinafter, also referred to as "triangular lattice structure") has good symmetry, and the light incident on the fine structure 104 has low angular dependency; therefore, the angular dependency of the intensity of the light output from the light-emitting device 100 can be reduced. However, the fine structure 104 in this embodiment is not limited to the structure illustrated in FIG. 1. Instead, the fine structure 104 may have a laminated structure in which fine particles are arranged in a triangular lattice on a plane parallel to the front panel 101. By dispersing fine particles in a solvent, applying the solution onto the front panel 101, and removing the solvent, a structure in which the fine particles are arranged can be prepared. At this time, by setting appropriate conditions for each step, the fine particles will be distributed in a triangular lattice, and a close-packed structure in which the fine particles closest to each other are in contact can be easily prepared. By selecting an appropriate diameter of the fine particles, the periods of the periodic structures can be controlled, and the structures according to this embodiment can be easily prepared. Alternatively, the second members 11 of the periodic structures 105 and 106 may be arranged in a tetragonal lattice (tetragonal lattice structure) or any other periodic arrangement. The periodic structure 105 and the periodic structure 106 may have different basic lattice vectors.

The front panel 101 in this embodiment may be made of a transmissive material that transmits visible light and may be made of plastic. The excitation source includes an electrode disposed on the back side (the side opposing the electron-emitting device) of the light-emitting layer 102 and may further include an electron-emitting device on the back side of the electrode. Instead, the excitation source may have positive and negative poles disposed between the front panel 101 and the light-emitting layer 102 and on the back side of the light-emitting layer 102. By applying an electric current across the electrodes and injecting electrons and holes, light is generated at the light-emitting layer 102. Instead, the excitation source may be configured such that an electrode is disposed on the front panel; a cell and another electrode are arranged on the back side of the light-emitting layer 102; and gas that generates ultraviolet rays by plasma is sealed in a cell. With such a configuration, when an electric current is applied to the gas inside the cell, an ultraviolet ray is generated and emitted to fluorescent particles, exciting the fluorescent particles and generating light. The light-emitting layer 102 may be prepared by dispersing fluorescent particles in a medium having a refractive index that is the same as that of the fluorescent particles. With such a configuration, scattered reflection due to a difference in the refractive indexes at the boundary of each fluorescent particle and the surrounding medium can be reduced, and diffused reflection at the light-emitting layer 102 can be suppressed. The medium of the light-emitting layer 102 may have a refractive index other that described in this embodiment.

FIRST EXAMPLE

Figure 7:
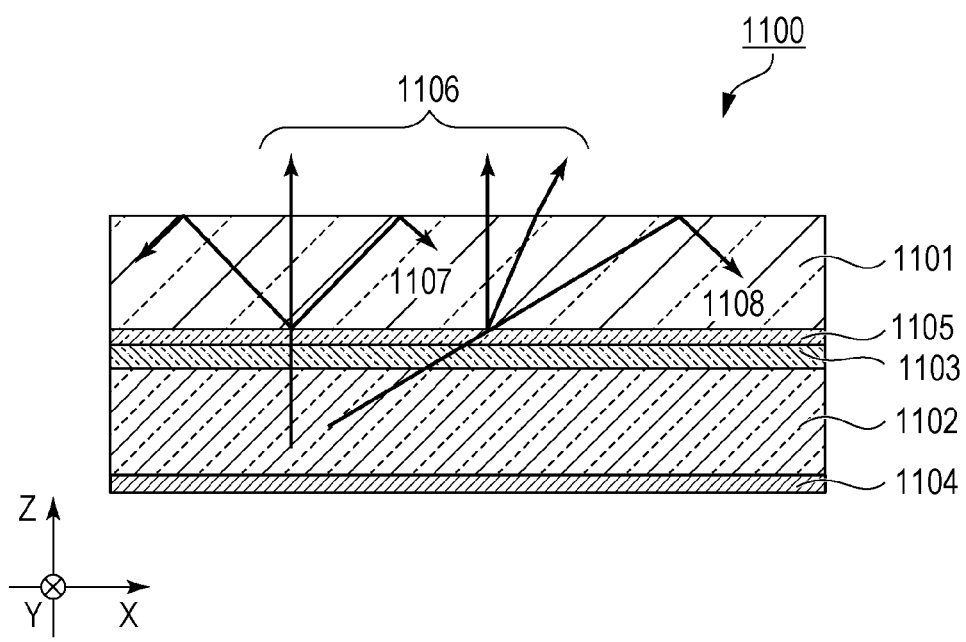
FIG. 7 is an xz sectional view of a known light-emitting device.

A first example will be described below with reference to the drawings. FIGS. 1A to 1C illustrate an example fine structure 104 included in the light-emitting device 100 according to this embodiment. With the fine structure 104 in FIGS. 1A to 1C, the length of the arrangement period (lattice period) 12 of the columnar structures 11, which are the second members 11, of the periodic structure 105 is 1800 nm, and the diameter 13 and height 14 of each columnar structure is 1500 nm. The proportion of the diameter 13 to the arrangement period (lattice period) 12 of the columnar structures 11, which are the second members 11, of the periodic structure 106 (i.e., the quotient of the diameter 13 and the arrangement period 12) is 0.83, and the height 14 and diameter 13 of the columnar structure are the same. The refractive index of the medium constituting the columnar structures is 2.2, and the refractive index of the medium constituting the first member 10 surrounding the columnar structures 11 is 1.5. The front panel 101 and the light-emitting layer 102 are made of a medium having a refractive index of 1.5. The transparent electrode 103, which is part of the excitation source, is interposed between the light-emitting layer 102 and the fine structure 104 and is made of a medium having a refractive index of 1.8. The electron-emitting device 118, which is part of the excitation source, is disposed on the back side of the light-emitting layer 102. The space on the back side of the light-emitting layer 102 is a vacuum. The wavelength of the light emitted from the light-emitting layer 102 is 550 nm. FIG. 4 illustrates the calculation results of light-extraction efficiency when the period of the periodic structure 106 in such a light-emitting device is varied from 200 to 1800 nm. In FIG. 4, the horizontal axis represents the difference between the lengths of the arrangement periods (lattice periods) of the second members 11 (columnar structures 11) in the periodic structure 105 and the periodic structure 106, and the vertical axis represents light-extraction efficiency. FIG. 4 also illustrates the light-extraction efficiency for a light-emitting device having a known fine structure. In FIG. 4, the dotted line 117 represents the characteristic of a known structure, and the solid line 116 represents the characteristic of this example. The known fine structure 1105, which is illustrated in FIG. 7, has a lattice period length of 1800 nm, and the columnar structures have a diameter and height of 1500 nm. That is the known fine structure includes only a periodic structure equivalent to the periodic structure 105 in this example. The refractive indexes of the media constituting the front panel 1101, the light-emitting layer 1102, and the transparent electrode 1103 are the same as those in this embodiment. The reflectance of the boundary of the front panel 101 and the outside region is ignored because the configuration in this example and a known configuration are the same. Light-extraction efficiency is calculated by electromagnetic field analysis.

As illustrated in FIG. 4, this example enables light-extraction efficiency higher than that of a known structure. Specifically, with the configuration according to the present invention, the light-extraction efficiency is higher than that of a known structure where the difference of the arrangement period (lattice period) of the second members 11 of the periodic structure 105 and the arrangement period (lattice period) of the second members 11 of the periodic structure 106 is 0.6 µm or larger. This holds for the periodic structure 105 of the fine structure 104 in this example and the fine structure 1105 in a comparative example when the media of the fine structures and the shapes of the columnar structures are the same; this does not necessarily hold when the media of the fine structures and the shapes of the columnar structures are not the same. As described in the embodiment above, it is important that the arrangement period of the second members 11, which have a refractive index different from that of the first member 10, of the first fine substructure differ from the arrangement period of the second members 11, which have a refractive index different from that of the first member 10, of the second fine substructure, so that the transmitted light 110 transmitted at a small angle and the transmitted light 111 transmitted at a large angle are both affected to reduce the amount of lost light 108 and increase the amount of output light 107.

As described above, in the light-emitting device 100 according to this embodiment, the fine structure 104, which includes the periodic structure 105 and the periodic structure 106, is interposed between the front panel 101 and the light-emitting layer 102 to appropriately set the difference of the lattice periods. In this way, the incident angles of the periodic structure 105 and the periodic structure 106 will differ from each other. Consequently, a light-emitting device having high light-extraction efficiency can be acquired.

SECOND EXAMPLE

Figure 5:
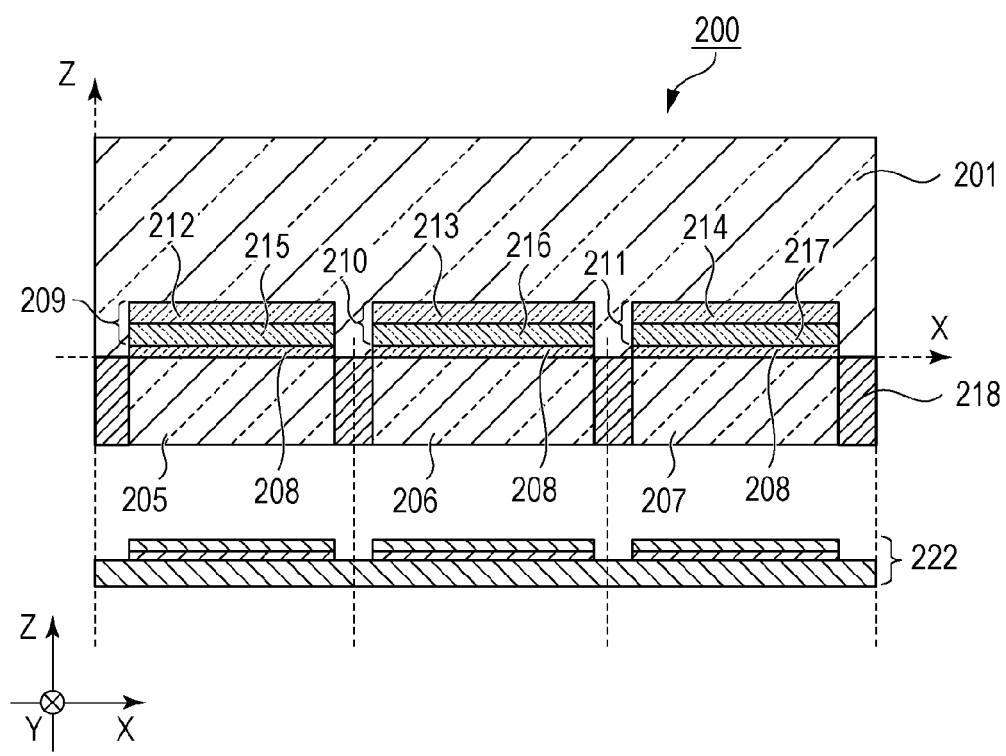
FIG. 5 is an xz sectional view of a light-emitting device according to a second example of the present invention.
Figure 6:
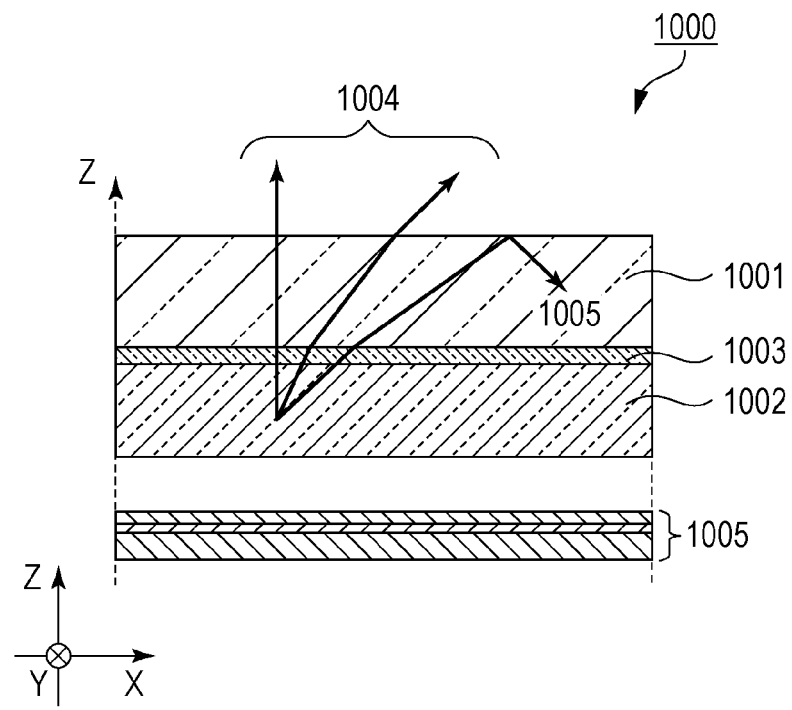
FIG. 6 is an xz sectional view of a known light-emitting device.

FIG. 5 illustrates, in outline, the configuration of a light-emitting device 200 according to this example. FIG. 5 is an xz sectional view of the light-emitting device 200 according to this example. The light-emitting device 200 includes a front panel 201, fine structures 209, 210, and 211, which are disposed on the front panel 201, and light-emitting layers 205, 206, and 207, which respectively emit red, green, and blue light and are disposed on the front panel 201 with the fine structures 209, 210, and 211 interposed therebetween. It is desirable that a transparent electrode 208, which is part of an excitation source, is interposed between the fine structures 209, 210, and 211 and the light-emitting layers 205, 206, and 207. The light-emitting layers 205, 206, and 207 are separated by partition members 218 made of a medium that absorbs light. FIG. 5 illustrates the three light-emitting layers 205, 206, and 207. The plurality of light-emitting layers enables display of color images. The front panel 201 is made of a transmissive medium that transmits visible light, for example, glass.

The light-emitting layers 205, 206, and 207 include fluorescent members that generate light of wavelengths corresponding to the colors red, green and blue.

The fine structures 209, 210, and 211 have the same structure as that of the fine structure 104, which is illustrated in FIG. 1. That is, fine substructures (periodic structures) 212, 213, and 214 have the same configuration as that of the periodic structure 106, which is illustrated in FIG. 1, and fine substructures (periodic structures) 215, 216, and 217 have the same configuration as that of the periodic structure 105, which is illustrated in FIG. 1.

The fine substructures 209, 210, and 211 have different structures or are made of different media.

An electron-emitting device 222, which is part of the excitation source, opposes the light-emitting layers 205, 206, and 207. In such a configuration, when an electric field is applied to the electron-emitting device 222, electrodes are emitted and supplied to the light-emitting layers 205, 206, and 207, generating light. The generated light is transmitted through the fine substructures 209, 210, and 211 and the front panel 201 and is extracted outside as output light.

With the light-emitting device 200 according to the second example, similar to the first example described above, the lattice periods, diameter and height of the columnar structures, and the refractive index of the media of the fine substructures 209, 210, and 211 are set appropriately. In this way, light-extraction efficiency can be improved, and images of high luminance can be displayed.

With the light-emitting device 200 according to the second example, the fine substructures 209, 210, and 211, which correspond to different colors, have different structures (different media and shapes of the structural members). However, the light-emitting device 200 is not limited thereto. For example, one of the fine substructures corresponding to red, green, and blue may differ from the other two fine substructures. In this way, compared to when fine substructures of the same structure are disposed, light-extraction efficiency is improved, and an image with high-luminance output light can be displayed. The fine substructures disposed on the light-emitting layers may have the same structure. By having the same structure, the effects describe above is reduced but the production method and conditions do not need to be changed for each light-emitting layer, thus facilitating production.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-283774 filed Dec. 20, 2010, which is hereby incorporated by reference herein in its entirety.

What is claimed is:

1. A light-emitting device comprising:
   a substrate;
   a light-emitting layer; and
   a fine structure interposed between the light-emitting layer and the substrate,
   wherein,
   the fine structure includes a laminate, the laminate includes a first fine substructure and a second fine substructure,
   the first fine substructure and the second fine substructure each includes a first member and second members, the second members having a refractive index different from the refractive index of the first member and being periodically arranged within the first member in a direction parallel to a surface of the substrate, and
   an arrangement period of the second members of the first fine substructure differs from an arrangement period of the second members of the second substructure.

2. The light-emitting device according to claim 1, wherein, the light-emitting layer includes a light-emitting material capable of emitting light in a wavelength range of 350 nm and 800 nm, and
   the arrangement period of the second members of the first fine substructure and the arrangement period of the second members of the second fine substructure are in the range of 0.2 and 5 μm.

3. The light-emitting device according to claim 1, wherein at least one of the arrangement period of the second members of the first fine substructure and the arrangement period of the second members of the second fine substructure is in the range of 1 and 3 μm.

4. The light-emitting device according to claim 3, wherein at least one of the arrangement period of the second members in the first fine substructure and the arrangement period of the second members in the second fine substructure is in the range of 1.5 and 2.5 μm.

5. The light-emitting device according to claim 1, wherein a difference between the arrangement period of the second members of the first fine substructure and the arrangement period of the second members of the second fine substructure is 0.6 μm or larger.

6. The light-emitting device according to claim 1, wherein, in the fine structure, the first fine substructure is disposed closer to the light-emitting layer than the second fine substructure, and
   the arrangement period of the second members in the first fine substructure is larger than the arrangement period of the second members in the second fine substructure.

7. The light-emitting device according to claim 1, wherein the second members of the first fine substructure and the second members of the second fine substructure are arranged in a triangular lattice.

8. The light-emitting device according to claim 1, wherein the second members of the first fine substructure and the second members of the second fine substructure are columnar structures arranged in a lattice.

9. The light-emitting device according to claim 1, wherein the light-emitting device includes a plurality of light-emitting sublayers emitting red, blue or green light.

\* \* \* \* \*